United States Patent
Liu et al.

(10) Patent No.: US 12,245,455 B2
(45) Date of Patent: Mar. 4, 2025

(54) DISPLAY SUBSTRATE COMPRISING A FIRST ELECTRODE LAYER INCLUDING A REFLECTIVE LAYER, AN INSULATING LAYER AND A TRANSPARENT CONDUCTIVE LAYER AND METHOD FOR MANUFACTURING AND DISPLAY APPARATUS HAVING THE SAME

(71) Applicant: BOE TECHNOLOGY GROUP CO., LTD., Beijing (CN)

(72) Inventors: Li Liu, Beijing (CN); Pengcheng Lu, Beijing (CN); Kui Zhang, Beijing (CN); Yunlong Li, Beijing (CN); Shengji Yang, Beijing (CN); Kuanta Huang, Beijing (CN); Xiaochuan Chen, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 17/641,316

(22) PCT Filed: Jan. 8, 2021

(86) PCT No.: PCT/CN2021/070863
§ 371 (c)(1),
(2) Date: Mar. 8, 2022

(87) PCT Pub. No.: WO2021/139769
PCT Pub. Date: Jul. 15, 2021

(65) Prior Publication Data
US 2022/0302418 A1  Sep. 22, 2022

(30) Foreign Application Priority Data
Jan. 9, 2020 (CN) .......................... 202020046936.9

(51) Int. Cl.
*H10K 50/13* (2023.01)
*H10K 50/844* (2023.01)
(Continued)

(52) U.S. Cl.
CPC ........... *H10K 50/856* (2023.02); *H10K 50/13* (2023.02); *H10K 50/844* (2023.02); *H10K 71/00* (2023.02);
(Continued)

(58) Field of Classification Search
CPC ...... H10K 50/856; H10K 50/13; H10K 71/00; H10K 50/844
(Continued)

(56) References Cited

U.S. PATENT DOCUMENTS

2007/0029539 A1\* 2/2007 Yashima .............. H10K 59/875
257/13
2010/0052524 A1 3/2010 Kinoshita
(Continued)

FOREIGN PATENT DOCUMENTS

CN 101661951 A 3/2010
CN 107799563 A 3/2018
(Continued)

OTHER PUBLICATIONS

Notice of Correction for Chinese Patent Application No. 202020046936.9 issued by the Chinese Patent Office on May 25, 2020.

*Primary Examiner* — Phuc T Dang
(74) *Attorney, Agent, or Firm* — XSENSUS LLP

(57) ABSTRACT

A display substrate includes a substrate and a light-emitting device layer which includes a first electrode layer, a light-emitting functional layer, and a second electrode layer that are sequentially stacked in a direction away from the substrate. The first electrode layer includes a reflective layer, an
(Continued)

insulating layer, and a transparent conductive layer that are sequentially stacked in the direction away from the substrate. In a red sub-pixel region, a thickness of a first portion of the insulating layer is within a range of about 1000 Å to about 2500 Å. In a green sub-pixel region, a thickness of a second portion of the insulating layer is within a range of about 500 Å to about 2000 Å. In a blue sub-pixel region, a thickness of a third portion of the insulating layer is within a range of about 1500 Å to about 3000 Å.

19 Claims, 6 Drawing Sheets

(51) Int. Cl.
*H10K 50/856* (2023.01)
*H10K 71/00* (2023.01)
*H10K 102/00* (2023.01)
*H10K 102/10* (2023.01)

(52) U.S. Cl.
CPC . *H10K 2102/101* (2023.02); *H10K 2102/351* (2023.02)

(58) Field of Classification Search
USPC .............................................. 257/79
See application file for complete search history.

(56) References Cited

U.S. PATENT DOCUMENTS

| | | | |
|---|---|---|---|
| 2012/0081892 A1* | 4/2012 | Kubota | G02B 27/017 |
| | | | 362/296.01 |
| 2014/0183460 A1 | 7/2014 | Kim et al. | |
| 2017/0271418 A1* | 9/2017 | Li | H10K 59/122 |
| 2018/0062116 A1* | 3/2018 | Park | H10K 59/38 |
| 2019/0341440 A1* | 11/2019 | Cha | G09G 3/3266 |

FOREIGN PATENT DOCUMENTS

| | | | | |
|---|---|---|---|---|
| CN | 109148725 A | * | 1/2019 | ............. H10K 71/00 |
| CN | 211743193 U | | 10/2020 | |
| JP | H07140446 A | * | 6/1995 | ......... G02F 1/13415 |
| KR | 20160055015 A1 | * | 5/2016 | |

* cited by examiner

DISPLAY SUBSTRATE COMPRISING A FIRST ELECTRODE LAYER INCLUDING A REFLECTIVE LAYER, AN INSULATING LAYER AND A TRANSPARENT CONDUCTIVE LAYER AND METHOD FOR MANUFACTURING AND DISPLAY APPARATUS HAVING THE SAME

CROSS-REFERENCE TO RELATED APPLICATIONS

This application is a national phase entry under 35 USC 371 of International Patent Application No. PCT/CN2021/070863 filed on Jan. 8, 2021, which claims priority to Chinese Patent Application No. 202020046936.9, filed on Jan. 9, 2020, which are incorporated herein by reference in their entirety.

TECHNICAL FIELD

The present disclosure relates to the field of display technologies, and in particular, to a display substrate and a method for manufacturing the same, and a display apparatus.

BACKGROUND

As a new type of panel, an organic light-emitting diode (OLED) display panel has been widely utilized in a smart watch, a mobile phone, a tablet computer, a computer monitor and other devices.

SUMMARY

In an aspect, a display substrate is provided. The display substrate has a plurality of sub-pixel regions. The plurality of sub-pixel regions includes at least one red sub-pixel region, at least one green sub-pixel region, and at least one blue sub-pixel region. The display substrate includes a substrate and a light-emitting device layer disposed on a side of the substrate. The light-emitting device layer includes a first electrode layer, a light-emitting functional layer, and a second electrode layer that are sequentially stacked in a direction away from the substrate. The first electrode layer includes a reflective layer, an insulating layer, and a transparent conductive layer that are sequentially arranged on the side of the substrate. Vertical distances from portions, located in the plurality of sub-pixel regions, of a surface of the reflective layer away from the substrate to the substrate are all equal, and vertical distances from portions, located in the plurality of sub-pixel regions, of a surface of the insulating layer away from the substrate to the second electrode layer are all equal. In a red sub-pixel region, a thickness of a first portion of the insulating layer located between the reflective layer and the transparent conductive layer is within a range of about 1000 Å to about 2500 Å. In a green sub-pixel region, a thickness of a second portion of the insulating layer located between the reflective layer and the transparent conductive layer is within a range of about 500 Å to about 2000 Å. In a blue sub-pixel region, a thickness of a third portion of the insulating layer located between the reflective layer and the transparent conductive layer is within a range of about 1500 Å to about 3000 Å.

In some embodiments, the reflective layer includes a plurality of reflective units that are spaced apart from each other, and the transparent conductive layer includes a plurality of transparent conductive units that are spaced apart from each other. The transparent conductive units and the reflective units are in one-to-one correspondence, a transparent conductive unit and a corresponding reflective unit are electrically connected, and the transparent conductive unit and the reflective unit that are correspondingly electrically connected are located in a same sub-pixel region. In the same sub-pixel region, an orthogonal projection of the reflective unit on the substrate is within a range of an orthogonal projection of a corresponding transparent conductive unit on the substrate.

In some embodiments, the transparent conductive unit includes a flat surface in a middle and side faces on peripheries, and an included angle between the flat surface and a side face is an obtuse angle. The orthogonal projection of the reflective unit on the substrate substantially overlaps with an orthogonal projection of the flat surface on the substrate.

In some embodiments, the reflective unit includes a metal portion.

In some embodiments, a material of the metal portion includes aluminum.

In some embodiments, the reflective unit further includes a first protective portion disposed on a side of the metal portion facing away from the transparent conductive layer, and/or, a second protective portion disposed on a side of the metal portion proximate to the transparent conductive layer.

In some embodiments, the first protective portion includes a first protective sub-portion, a material of which includes titanium, and/or, a second protective sub-portion, a material of which includes titanium nitride. The second protective portion includes a third protective sub-portion, a material of which includes titanium, and/or, a fourth protective sub-portion, a material of which includes titanium nitride.

In some embodiments, in a case where the first protective portion includes the first protective sub-portion and the second protective sub-portion, the first protective sub-portion is located on a side of the second protective sub-portion away from the metal portion. In a case where the second protective portion includes the third protective sub-portion and the fourth protective sub-portion, the third protective sub-portion is located on a side of the fourth protective sub-portion away from the metal portion.

In some embodiments, the insulating layer is provided with a plurality of via holes therein, and the transparent conductive unit is electrically connected with the corresponding reflective unit through a via hole.

In some embodiments, the via hole is filled with tungsten.

In some embodiments, a thickness of the transparent conductive layer is within a range of about 100 Å to about 2000 Å.

In some embodiments, the display substrate further includes a pixel circuit layer disposed between the substrate and the light-emitting device layer.

In some embodiments, shapes of the orthogonal projection of the reflective unit on the substrate and the orthogonal projection of the corresponding transparent conductive unit on the substrate are same or different.

In some embodiments, the first protective portion is a conductive protective portion, or the first protective portion is an insulating protective portion.

In some embodiments, the second protective portion is a conductive protective portion, or the first protective portion is an insulating protective portion.

In another aspect, a display apparatus is provided, and the display apparatus includes the display substrate according to any one of the above embodiments.

In yet another aspect, a method for manufacturing a display substrate is provided, including: providing a substrate; forming a reflective layer on a side of the substrate; forming an insulating layer on a side of the reflective layer away from the substrate; forming a transparent conductive layer on a side of the insulating layer away from the substrate; forming a light-emitting functional layer on a side of the transparent conductive layer away from the substrate; and forming a second electrode layer on a side of the light-emitting functional layer away from the substrate. The display substrate has a plurality of sub-pixel regions, and the plurality of sub-pixel regions include at least one red sub-pixel region, at least one green sub-pixel region, and at least one blue sub-pixel region. Vertical distances from portions, located in the plurality of sub-pixel regions, of a surface of the reflective layer away from the substrate to the substrate are all equal, and vertical distances from portions, located in the plurality of sub-pixel regions, of a surface of the insulating layer away from the substrate to the second electrode layer are all equal. In a red sub-pixel region, a thickness of a first portion of the insulating layer located between the reflective layer and the transparent conductive layer is within a range of about 1000 Å to about 2500 Å. In a green sub-pixel region, a thickness of a second portion of the insulating layer located between the reflective layer and the transparent conductive layer is within a range of about 500 Å to about 2000 Å. In a blue sub-pixel region, a thickness of a third portion of the insulating layer located between the reflective layer and the transparent conductive layer is within a range of about 1500 Å to about 3000 Å.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
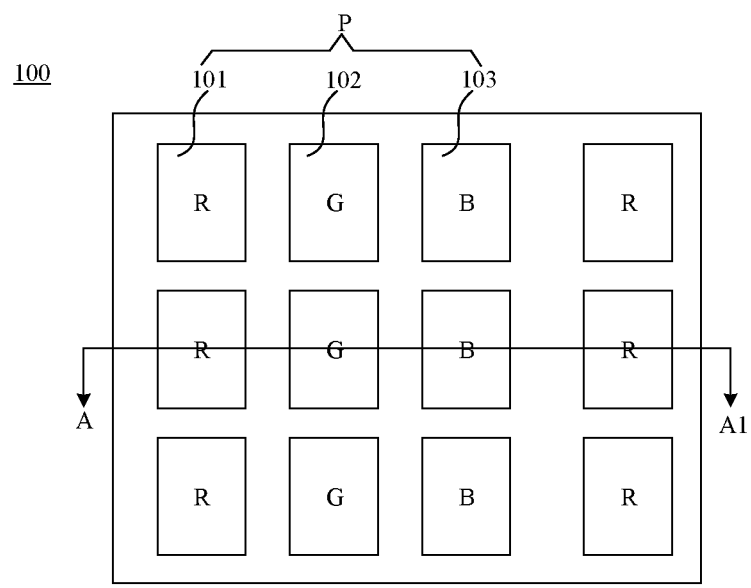
FIG. 1 is a top view of a display substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on the basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are only used for descriptive purposes, and are not to be construed as indicating or implying relative importance or implicitly indicating the number of indicated technical features. Thus, features defined as "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and their extensions may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about", "substantially" or "approximately" as used herein includes a stated value and an average value within an acceptable range of deviation of to a particular value. The acceptable range of deviation is determined by a person of ordinary skill in the art, in consideration of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions may be enlarged for clarity. Variations in shapes with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

An organic light-emitting diode (OLED) display panel includes a light-emitting device layer, and the light-emitting device layer includes a light-emitting functional layer. A material of the light-emitting functional layer generally has a large full width at half maximum (FWHM), which is generally not less than 100 nm. Due to a non-uniform spreading effect of a sideband vibration and a transition of the material of the light-emitting functional layer, a light-emitting performance of the light-emitting device layer is affected. For example, light emitted by the light-emitting device layer has low color purity. Blue light is most affected by the spreading effect, followed by green light, and finally red light.

Figure 2:
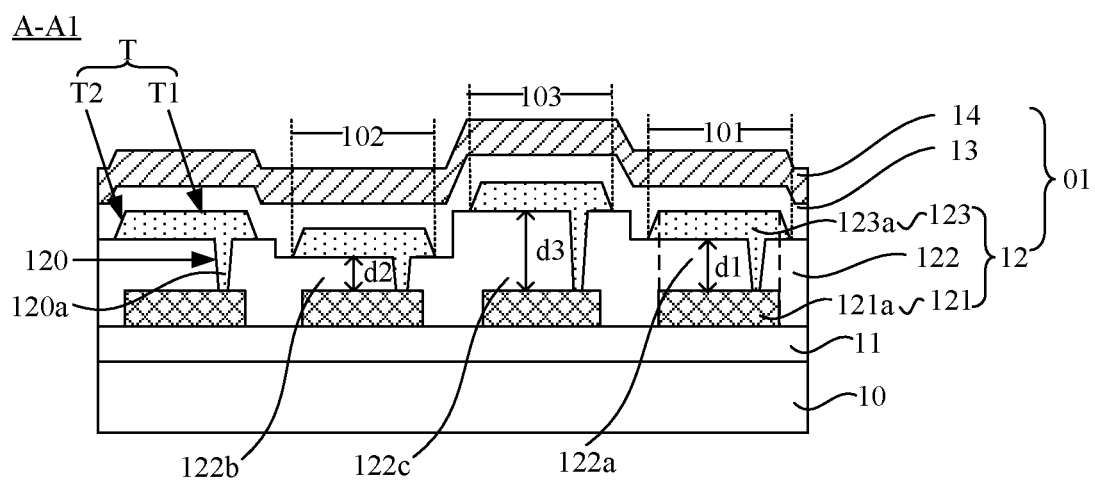
FIG. 2 is a sectional view of the display substrate in FIG. 1 taken along the direction A-A1.

On this basis, in some embodiments of the present disclosure, a display substrate 100 is provided. As shown in FIGS. 1 and 2, the display substrate 100 has a plurality of sub-pixel regions P, and the plurality of sub-pixel regions P includes at least one red sub-pixel region 101, at least one green sub-pixel region 102, and at least one blue sub-pixel region 103.

The display substrate 100 includes a substrate 10 and a light-emitting device layer 01 disposed on a side of the substrate 10. The light-emitting device layer 01 includes a first electrode layer 12, a light-emitting functional layer 13, and a second electrode layer 14 that are sequentially stacked in a direction away from the substrate 10. The first electrode layer 12 includes a reflective layer 121, an insulating layer 122, and a transparent conductive layer 123 that are sequentially arranged on the side of the substrate 10 and in the direction away from the substrate 10.

As shown in FIG. 2, vertical distances from portions, located in the plurality of sub-pixel regions, of a surface of the reflective layer 121 away from the substrate 10 to the substrate 10 are all equal, and vertical distances from portions, located in the plurality of sub-pixel regions, of a surface of the insulating layer 122 away from the substrate 10 to the second electrode layer 14 are all equal. In a red sub-pixel region 101, a thickness d1 of a first portion 122a of the insulating layer 122 located between the reflective layer 121 and the transparent conductive layer 123 is within a range of about 1000 Å to about 2500 Å (for example, the thickness d1 of the first portion 122a may be 1000 Å, 1500 Å, 2000 Å, 2500 Å). In a green sub-pixel region 102, a thickness d2 of a second portion 122b of the insulating layer 122 located between the reflective layer 121 and the transparent conductive layer 123 is within a range of about 500 Å to about 2000 Å (for example, the thickness d2 of the second portion 122b may be 500 Å, 1000 Å, 1500 Å, 2000 Å). In a blue sub-pixel region 103, a thickness d3 of a third portion 122c of the insulating layer 122 located between the reflective layer 121 and the transparent conductive layer 123 is within a range of about 1500 Å to about 3000 Å (for example, the thickness d3 of the third portion 122c may be 1500 Å, 2000 Å, 2500 Å, 3000 Å).

It will be noted that, the term "about" described above may refer to, for example, a stated value, or it may fluctuate by ten percent up and down on a basis of the stated value.

The vertical distances from the portions, located in the plurality of sub-pixel regions, of the surface of the reflective layer 121 away from the substrate 10 to the substrate 10 are equal. That is, vertical distances from a surface of a portion, located between the reflective layer 121 and the transparent conductive layer 123, of the insulating layer 122 proximate to the substrate 10 to a surface of the substrate 10 proximate to the insulating layer 122 are equal. However, in a non-sub-pixel region between adjacent sub-pixel regions, vertical distances from the surface of the insulating layer 122 away from the substrate 10 to the surface of the substrate 10 proximate to the insulating layer 122 may be equal or unequal.

The vertical distances from the portions, located in the plurality of sub-pixel regions, of the surface of the insulating layer 122 away from the substrate 10 to the second electrode layer 14 are equal. On one hand, in the non-sub-pixel region, the distances from portions, at different positions, of the surface of the insulating layer 122 away from the substrate 10 to the second electrode layer 14 may be equal or unequal. On the other hand, the vertical distances from the portions, located in the plurality of sub-pixel regions, of the surface of the insulating layer 122 away from the substrate 10 to the second electrode layer 14 are all equal. That is, vertical distances from portions, located in the plurality of sub-pixel regions, of a surface of the insulating layer 122 proximate to the second electrode layer 14 to a surface of the second electrode layer 14 proximate to the insulating layer 122 are equal.

It will be noted that, the embodiments of the present disclosure do not limit a material of the substrate 10. For example, the substrate 10 may be made of polyimide, glass, or silicon.

In some examples, the first electrode layer 12 is an anode layer, and the second electrode layer 14 is a cathode layer. In some other examples, the first electrode layer 12 is a cathode layer, and the second electrode layer 14 is an anode layer.

In some embodiments, the reflective layer 121 may be formed using a photolithography process. Further, chemical mechanical polishing may also be performed on the reflective layer 121, so that vertical distances from portions, at different positions, of the surface of the reflective layer 121 away from the substrate 10 to the substrate 10 are all equal in the same sub-pixel region. That is, in the same sub-pixel region, the vertical distances from portions, at different positions, of the surface of a portion, located between the reflective layer 121 and the transparent conductive layer 123, of the insulating layer 122 proximate to the substrate 10 to the substrate 10 are all equal.

In some embodiments, after the reflective layer 121 is formed, the insulating layer 122 may be formed. Portions of the insulating layer 122 located in the red sub-pixel region 101, the green sub-pixel region 102, and the blue sub-pixel region 103 may be formed through three photolithography processes.

A process of forming the insulating layer 122 is related to a material of the insulating layer 122. In a case where the insulating layer 122 is made of a photosensitive material, the insulating layer 122 may be formed through deposition, exposure, and development. In a case where the insulating layer 122 is made of a non-photosensitive material, the insulating layer 122 may be formed through deposition, exposure, development, and etching.

Here, since an inorganic insulating material has a good effect of preventing penetrating of water vapor and oxygen, optionally, the insulating layer 122 is made of an inorganic insulating material. For example, the insulating layer 122 is made of silicon oxide.

In some embodiments, the light-emitting functional layer 13 and the second electrode layer 14 may be manufactured through an evaporation process.

In some embodiments, those skilled in the art should know that, for a light-emitting device layer having a top light-emitting structure, the first electrode layer 12 not only includes the transparent conductive layer 123, but also includes the reflective layer 121 located between the transparent conductive layer 123 and the substrate 10. As a result, light emitted by the light-emitting function layer 13 in a direction toward the first electrode layer 12 is reflected by the reflective layer 121, and meanwhile, light emitted by the light-emitting function layer 13 in a direction toward the second electrode layer 14 is transmitted. The embodiments of the present disclosure do not limit a material of the reflective layer 121, as long as it may conduct electricity and may reflect light.

For example, the reflective layer 121 may be made of metal.

In some embodiments, the transparent conductive layer 123 may be made of a transparent conductive oxide material.

For example, the transparent conductive layer 123 may be made of indium tin oxide (ITO).

In some embodiments, a thickness of the transparent conductive layer 123 is not limited.

For example, the thickness of the transparent conductive layer 123 may be within a range of about 100 Å to about 2000 Å (for example, the thickness of the transparent conductive layer 123 may be 100 Å, 1000 Å, 1500 Å, or 2000 Å). Herein, the term "about" may refer to, for example, a stated value (e.g., 100 Å), or it may fluctuate by ten percent up and down on a basis of the stated value (e.g., 100 Å).

In some embodiments, as shown in FIG. 2, the reflective layer 121 includes a plurality of reflective units 121a that are spaced apart from each other, and the transparent conductive layer 123 includes a plurality of transparent conductive units 123a that are spaced apart from each other. The transparent conductive units 123a and the reflective units 121a are in one-to-one correspondence, and a transparent conductive unit 123a and a corresponding reflective unit 121a are electrically connected. The transparent conductive unit 123a and the reflective unit 121a that are correspondingly electrically connected are located in the same sub-pixel region. In the same sub-pixel region, an orthogonal projection of the reflective unit 121a on the substrate 10 is located within a range of an orthogonal projection of a corresponding transparent conductive unit 123a on the substrate 10. In this way, light emitted by the light-emitting functional layer 13 toward the first electrode layer 12 may be reflected by the reflective unit 121a corresponding to the transparent conductive unit 123a.

In some embodiments, that the orthogonal projection of the reflective unit 121a on the substrate 10 is located within the range of the orthogonal projection of the corresponding transparent conductive unit 123a on the substrate 10, includes that: the orthogonal projection of the reflective unit 121a on the substrate 10 exactly overlaps with the orthogonal projection of the corresponding transparent conductive unit 123a on the substrate 10; alternatively, the orthogonal projection of the reflective unit 121a on the substrate 10 is located within the range of the orthogonal projection of the corresponding transparent conductive unit 123a on the substrate 10, and an area of the orthogonal projection of the reflective unit 121a on the substrate 10 is less than an area of the orthogonal projection of the corresponding transparent conductive unit 123a on the substrate 10.

In some embodiments, shapes of the reflective unit 121a and the transparent conductive unit 123a are not limited. For example, they may be designed in accordance with required light-emitting areas.

Shapes of the orthogonal projection of the reflective unit 121a and the orthogonal projection of the corresponding transparent conductive unit 123a on the substrate 10 may be the same or different.

Figure 3:
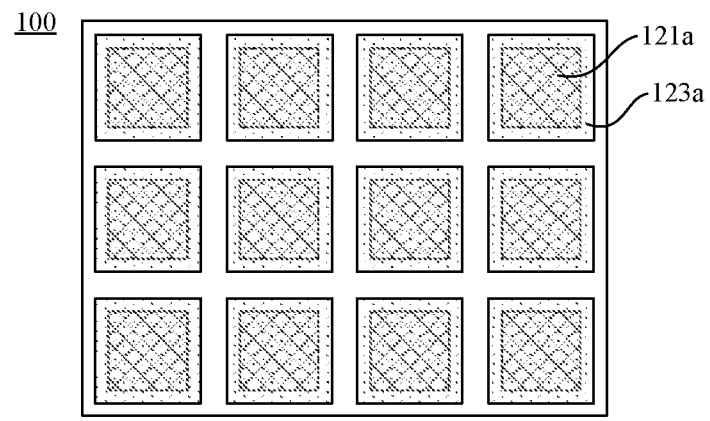
FIG. 3 is a top view of another display substrate, in accordance with some embodiments.
Figure 4:
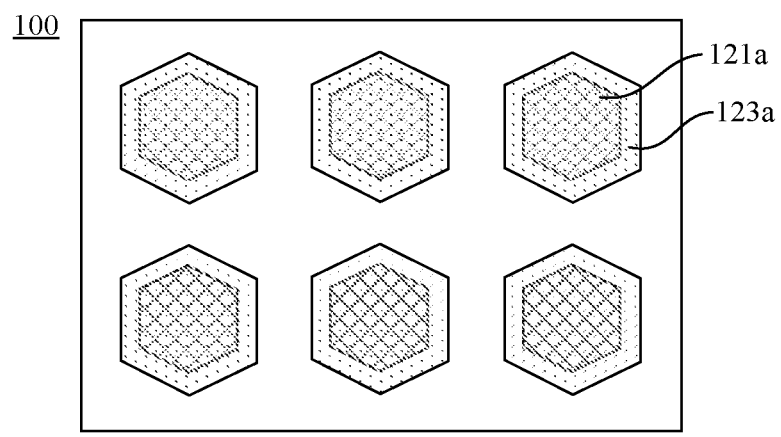
FIG. 4 is a top view of yet another display substrate, in accordance with some embodiments.

For example, as shown in FIG. 3, the shapes of the orthogonal projection of the reflective unit 121a on the substrate 10 and the orthogonal projection of the transparent conductive unit 123a on the substrate 10 are both rectangles. Or, as shown in FIG. 4, the shapes of the orthogonal projection of the reflective unit 121a on the substrate 10 and the orthogonal projection of the transparent conductive unit 123a on the substrate 10 are both hexagons.

In the display substrate provided in some embodiments of the present disclosure, the vertical distances from portions, located in the plurality of sub-pixel regions, of the surface of the reflective layer 121 away from the substrate 10 to the substrate 10 are all equal, and the vertical distances from portions, located in the plurality of sub-pixel regions, of the surface of the insulating layer 122 away from the substrate to the second electrode layer 14 are all equal. Therefore, microcavity lengths (i.e., vertical distances each from a surface of the reflective layer 121 proximate to the second electrode layer 14 to a surface of the second electrode layer 14 proximate to the reflective layer 121) of the light-emitting device layer 01 in sub-pixel regions of different colors may be adjusted by adjusting thicknesses of portions, each located between the reflective layer 121 and the transparent conductive layer 123, of the insulating layer 122. As a result, FWHMs of emission spectra of the light-emitting device layer 01 in the sub-pixel regions of different colors may be changed.

For example, the FWHM of a spectrum satisfies a formula:

$$FWHM = \frac{\lambda^2}{2L} \times \frac{1-\sqrt{R_1 R_2}}{\pi (R_1 R_2)^{1/4}}.$$

Where L is a length of a microcavity, $\lambda$ is a wavelength, and $R_1$ and $R_2$ are reflectivity of the reflective layer 121 and the second electrode layer 14 respectively.

It can be seen from the above formula that, in a case where values of $\lambda$, $R_1$, and $R_2$ are constant, the greater the length of the microcavity L, the narrower the FWHM the emission spectrum. On this basis, in the red sub-pixel region 101, in a case where the thickness of the first portion of the insulating layer 122 located between the reflective layer 121 and the transparent conductive layer 123 is within the range of about 1000 Å to about 2500 Å, a microcavity length of the light-emitting device layer 01 in the red sub-pixel region 101 is large, and a FWHM of an emission spectrum of the light-emitting device layer 01 in the red sub-pixel region 101 is narrow. In the green sub-pixel region 102, in a case where the thickness of the second portion of the insulating layer 122 located between the reflective layer 121 and the transparent conductive layer 123 is within the range of about 500 Å to about 2000 Å, a microcavity length of the light-emitting device layer 01 in the green sub-pixel region 102 is large, and a FWHM of an emission spectrum of the light-emitting device layer 01 in the green sub-pixel region 102 is narrow. In the blue sub-pixel region 103, in a case where the thickness of the third portion of the insulating layer 122 located between the reflective layer 121 and the transparent conductive layer 123 is within the range of about 1500 Å to about 3000 Å, a microcavity length of the light-emitting device layer 01 in the blue sub-pixel region 103 is large, and a FWHM of an emission spectrum of the light-emitting device layer 01 in the blue sub-pixel region 103 is narrow. Therefore, the FWHMs of the emission spectra of the light-emitting device layer 01 in different sub-pixel regions may be improved, so that the FWHM of the emission spectrum in each sub-pixel region is improved, and the color purity of light emitted by the light-emitting device layer 01 in each sub-pixel region is high. In this way, not only the light-emitting performance of the light-emitting device layer may be improved, but also light emitted by the light-emitting device layer in the sub-pixel region of each color may be uniform. In a case where the display substrate is applied to the display panel, a display quality of the display panel may be improved.

It is worth pointing out that, since a wavelength of the blue light is short, even if the first portion 122a, the second portion 122b, and the third portion 122c, respectively corresponding to the red sub-pixel region 101, the green sub-pixel region 102, and the blue sub-pixel region 103, of the insulating layer 122 have the same thickness (e.g., 1500 Å), the FWHM of the spectrum of the light-emitting device layer 01 in the blue sub-pixel region 103 is also the narrowest. That is, in the display substrate 100 provided in some embodiments of the present disclosure, a color purity of the blue light is the highest, followed by the green light, and finally the red light.

In some embodiments, referring to FIG. 2, the transparent conductive unit 123a includes a flat surface T1 in a middle and side faces T2 on peripheries, and an included angle between the flat surface T1 and a side face T2 is an obtuse angle. The orthogonal projection of the reflective unit 121a on the substrate 10 substantially overlaps with an orthogonal projection of the flat surface T1 on the substrate 10.

The transparent conductive unit 123a includes the flat surface T1 in the middle and the side faces T2 on the peripheries, and the included angle between the flat surface T1 and the side face T2 is the obtuse angle. As a result, subsequent film layers (e.g., the light-emitting functional layer 13, the second electrode layer 14, etc.) are not easy to be broken during a formation process. Moreover, the display substrate 100 may emit light uniformly in a region corresponding to the flat surface T1.

Since a surface of the transparent conductive unit 123a away from the substrate 10 is uneven, the light-emitting device layer 01 has poor light emission uniformity at positions corresponding to the transparent conductive units 123a. In view of this, in some embodiments of the present disclosure, the orthogonal projection of the reflective unit 121a on the substrate 10 substantially overlaps with the orthogonal projection of the flat surface T1 on the substrate 10. In this way, when the light-emitting functional layer 13 emits light, light to the first electrode layer 12 in a direction perpendicular from the light-emitting functional layer 13 to the substrate 10 and a small amount of small-angle light in a direction toward the first electrode layer 12, both emitted by a portion of the light-emitting functional layer 13 that overlaps the orthogonal projection of the reflective unit 121a on the substrate 10, may be reflected by the reflective unit 121a. Light emitted by a portion of the light-emitting functional layer 13 that does not overlap the reflective unit 121a can hardly be reflected by the reflective unit 121a. Therefore, a problem of non-uniform light emission at a position of the display substrate corresponding to the side of the transparent conductive unit may be improved.

Figure 5:
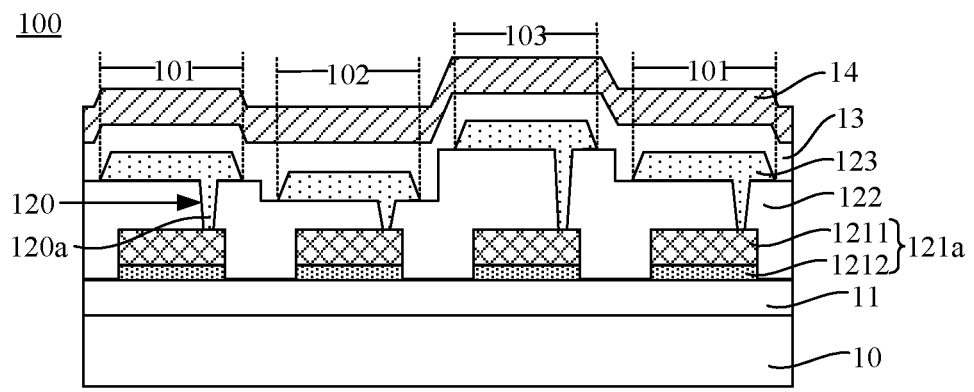
FIG. 5 is a diagram showing a structure of a display substrate, in accordance with some embodiments.

In some embodiments, as shown in FIG. 5, the reflective unit 121a may include a metal portion 1211. Optionally, a material of the metal portion 1211 may include aluminum. Since aluminum has a very high reflectivity to light, the material of the metal portion 1211 includes aluminum, which may improve the display brightness without changing the current.

Further, in some embodiments, as shown in FIG. 5, the reflective unit 121a further includes a first protective portion 1212 disposed on a side of the metal portion 1211 facing away from the transparent conductive layer 123. The first protective portion 1212 is arranged on the side of the metal portion 1211 facing away from the transparent conductive layer 123, so that it may be possible to prevent water vapor and oxygen from entering the metal portion 1211 from the side of the metal portion 1211 facing away from the transparent conductive layer 123, thereby helping to prevent the metal portion 1211 from being oxidized.

The first protective portion 1212 may be a conductive protective portion. Alternatively, the first protective portion 1212 may be an insulating protective portion.

A thickness of the first protective portion 1212 may be, for example, greater than 0 nm and less than or equal to about 200 nm. Here, the term "about" may refer to, for example, a stated value (i.e., 200 nm), or it may fluctuate by ten percent up and down on a basis of the stated value (i.e., 200 nm). It will be noted that the thickness of the first protective portion 1212 is not limited thereto.

It will be noted that, the embodiments of the present disclosure do not limit the thickness and a material of the first protective portion 1212, as long as the first protective portion 1212 may be used to protect the metal portion 1211 and prevent the metal portion 1211 from being oxidized.

Figure 6:
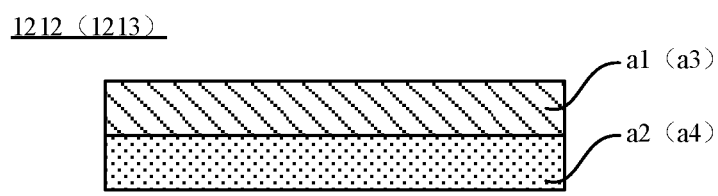
FIG. 6 is a diagram showing a structure of a first protective layer (or a second protective layer), in accordance with some embodiments.

For example, referring to FIG. 6, the first protective portion 1212 includes a first protective sub-portion a1 and/or a second protective sub-portion a2. That is, the first protective portion 1212 may only include the first protective sub-portion a1, or the first protective portion 1212 may only include the second protective sub-portion a2, or the first protective portion 1212 may include both the first protective sub-portion a1 and the second protective sub-portion a2. In a case where the first protective portion 1212 includes both the first protective sub-portion a1 and the second protective sub-portion a2, the first protective sub-portion a1 and the second protective sub-portion a2 are stacked in a thickness direction of the substrate 10.

A material of the first protective sub-portion a1 may include titanium, and a material of the second protective sub-portion a2 may include titanium nitride.

On this basis, for example, the first protective sub-portion a1 of the first protective portion 1212 is located on a side of the second protective sub-portion a2 of the first protective portion 1212 away from the metal portion 1211. In this way, the second protective sub-portion a2 made of the titanium nitride may be used to block migration of metal ions (e.g., metal materials that are prone to change in their chemical properties, such as aluminum) in the metal portion 1211.

Meanwhile, the first protective sub-portion a1 made of titanium may be used to improve adhesion performance between adjacent film layers, thereby helping to improve the stability and reliability of the display substrate 100.

Figure 7:
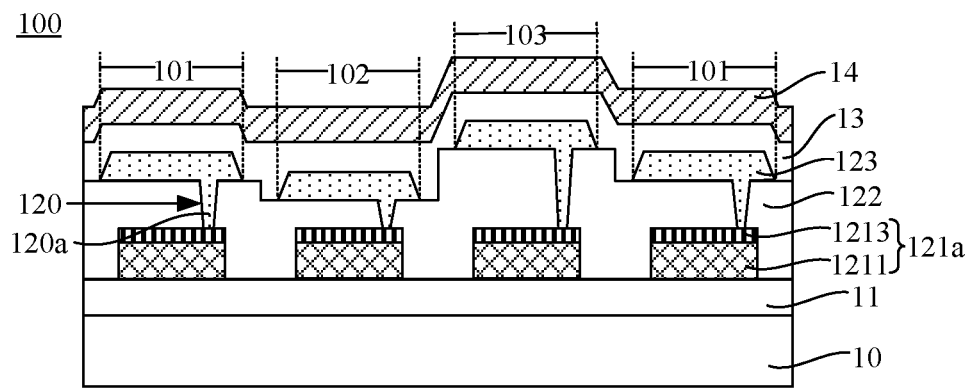
FIG. 7 is a diagram showing a structure of another display substrate, in accordance with some embodiments.

In some embodiments, as shown in FIG. 7, the reflective unit 121 may further include a second protective portion 1213 disposed on a side of the metal portion 1211 proximate to the transparent conductive layer 123. The second protective portion 1213 is arranged on the side of the metal portion 1211 proximate to the transparent conductive layer 123, so that it may be possible to prevent the water vapor and the oxygen from entering the metal portion 1211 from the side of the metal portion 1211 proximate to the transparent conductive layer 123, thereby helping to prevent the metal portion 1211 from being oxidized.

The second protective portion 1213 may be a conductive protective portion. In this case, the second protective portion 1213 is electrically connected to the metal portion 1211. Alternatively, the second protective portion 1213 may be an insulating protective portion. In this case, the second protective portion 1213 is not electrically connected to the metal portion 1211. In a case where the second protective portion 1213 is the insulating protective portion, for example, the second protective portion 1213 may be provided with via hole(s), so that the transparent conductive unit 123a may be electrically connected to the metal portion 1211 through the via hole(s) in the second protective portion 1213.

For example, a thickness of the second protective portion 1213 may be greater than 0 nm and less than or equal to about 200 nm. Here, the term "about" may refer to, for example, a stated value (i.e., 200 nm), or it may fluctuate by ten percent up and down on a basis of the stated value (i.e., 200 nm). It will be noted that the thickness of the second protective portion 1213 is not limited thereto.

It will be noted that, the embodiments of the present disclosure do not limit a material and the thickness of the second protective portion 1213, as long as the second protective portion 1213 may be used to protect the metal portion 1211 and prevent the metal portion 1211 from being oxidized.

For example, referring to FIG. 6, the second protective portion 1213 includes a third protective sub-portion a3 and/or a fourth protective sub-portion a4. That is, the second protective portion 1213 may only include the third protective sub-portion a3, or the second protective portion 1213 may only include the fourth protective sub-portion a4, or the second protective portion 1213 may include both the third protective sub-portion a3 and the fourth protective sub-portion a4. In a case where the second protective portion 1213 includes both the third protective sub-portion a3 and the fourth protective sub-portion a4, the third protective sub-portion a3 and the fourth protective sub-portion a4 are stacked in the thickness direction of the substrate 10.

A material of the third protective sub-portion a3 may include titanium, and a material of the fourth protective sub-portion a4 may include titanium nitride.

On this basis, for example, the third protective sub-portion a3 of the second protective portion 1213 is located on a side of the fourth protective sub-portion a4 of the second protective portion 1213 away from the metal portion 1211. In this way, the fourth protective sub-portion a4 made of the titanium nitride may be used to block the migration of metal ions (e.g., metal materials that are prone to change in their chemical properties, such as aluminum) in the metal portion 1211. Meanwhile, the third protective sub-portion a3 made of titanium may be used to improve adhesion performance between adjacent film layers, thereby helping to improve the stability and reliability of the display substrate 100.

Figure 8:
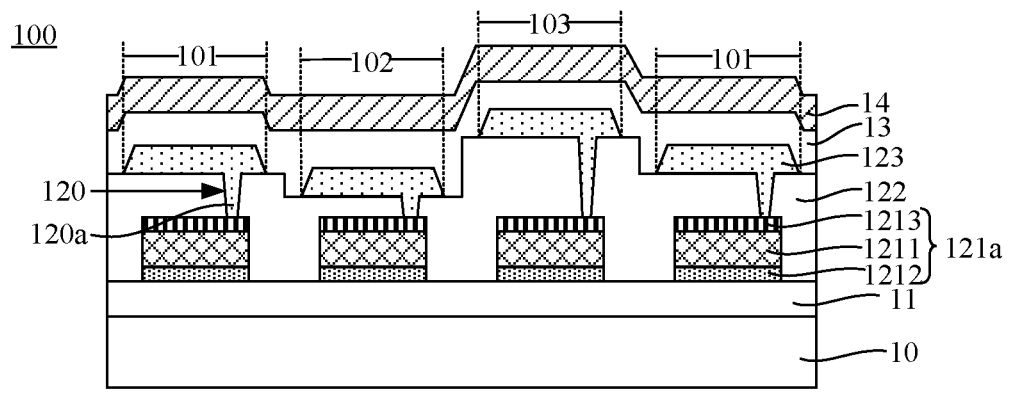
FIG. 8 is a diagram showing a structure of yet another display substrate, in accordance with some embodiments.

In yet some other embodiments, as shown in FIG. 8, the reflective unit 121a may further include both the first protective portion 1212 disposed on the side of the metal portion 1211 away from the transparent conductive layer 123 and the second protective portion 1213 disposed on the side of the metal portion 1211 proximate to the transparent conductive layer 123. In this way, it may be possible to prevent the water vapor and the oxygen from entering the metal portion 1211 from both the side of the metal portion 1211 facing away from the transparent conductive layer 123 and the side of the metal portion 1211 proximate to the transparent conductive layer 123, which may effectively prevent the metal portion 1211 from being oxidized.

Structures of the first protective portion 1212 and the second protective portion 1213 may be the structure provided by any of the embodiments described above.

In some embodiments, as shown in FIGS. 2, 5, 7 and 8, the insulating layer 122 is provided with a plurality of via holes 120 therein, and the transparent conductive unit 123a is electrically connected with the corresponding reflective unit 121a through a via hole 120.

Optionally, the via hole 120 is filled with tungsten 120a. Since tungsten has almost no effect on contact resistances of metal materials, such as aluminum, whose chemical properties are prone to change, the reflective unit 121a and the corresponding transparent conductive unit 123a may be electrically connected stably.

A size and a shape of the via hole are not limited, as long as the transparent conductive unit 123a may be fully electrically connected to the corresponding reflective unit 121a.

For example, an orthogonal projection of the via hole on the substrate 10 may be in a shape of a circle, and a diameter of the circle is greater than 0 nm and less than or equal to about 500 nm. Here, the term "about" may refer to, for example, a stated value (i.e., 500 nm), or it may fluctuate by ten percent up and down on a basis of the stated value (i.e., 500 nm).

In some embodiments, as shown in FIGS. 2, 5, 7, and 8, the display substrate 100 may further include a pixel circuit layer 11 disposed between the substrate 10 and the first electrode layer 12, and the pixel circuit layer 11 is used to drive the light-emitting functional layer 13 in the light-emitting device layer 01 to emit light. In some examples, the pixel circuit layer 11 includes a plurality of pixel circuits, and the pixel circuit includes at least switching transistor(s), a driving transistor, and storage capacitor(s).

Figure 9:
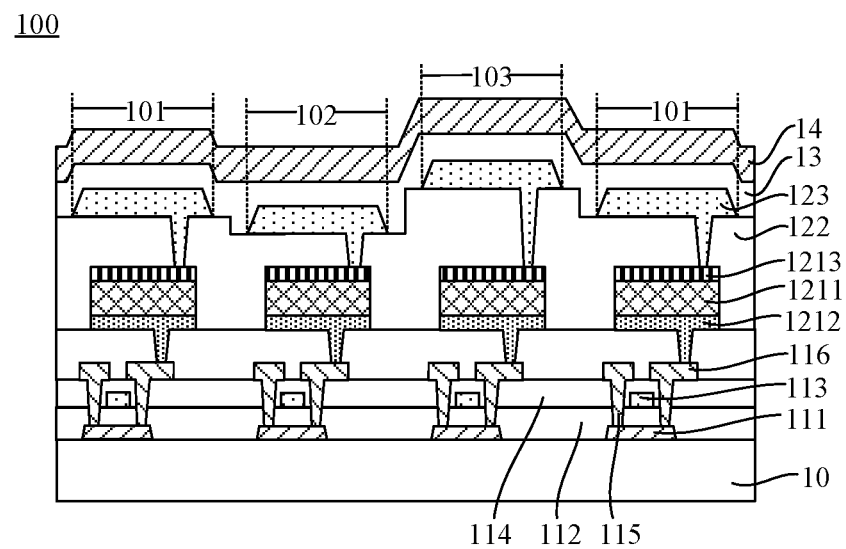
FIG. 9 is a diagram showing a structure of yet another display substrate, in to accordance with some embodiments.
Figure 10:
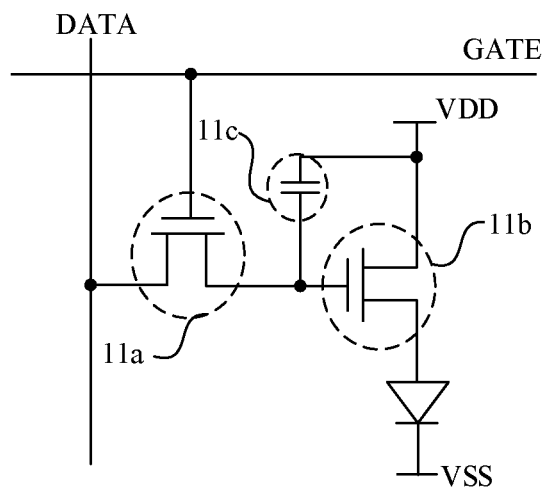
FIG. 10 is a circuit diagram of a pixel circuit, in accordance with some embodiments.

For example, as shown in FIGS. 9 and 10, considering a pixel circuit with a 2T1C structure as an example, the pixel circuit includes one switching transistor 11a, one driving transistor 11b, and one storage capacitor 11c. A source of the switching transistor 11a is connected to a data signal terminal (DATA), a gate of the switching transistor 11a is connected to a gate signal terminal (GATE), and a drain of the switching transistor 11a is connected to a gate 113 of the driving transistor 11b and one end of the storage capacitor 11c. A source 115 of the driving transistor 11b is connected to another end of the storage capacitor 11c and a VDD signal line or a VDD signal terminal, and a drain 116 of the driving transistor 11b is connected to one end of the light-emitting device layer (the first electrode layer 12). Another end of the light-emitting device layer (the second electrode layer 14) is connected to a VSS signal line or a VSS signal terminal.

The switching transistor 11a and the driving transistor 11b each may be one of a bottom-gate thin film transistor, a top-gate thin film transistor, and a double-gate thin film transistor.

Considering the top-gate thin film transistor as an example, referring to FIG. 9, the driving transistor 11b includes an active layer 111, a portion of a gate insulating layer 112 located in the driving transistor 11b, a gate 113, a portion an interlayer insulating layer 114 located in the driving transistor 11b, and a source 115 and a drain 116 that are sequentially stacked. The switching transistor 11a includes another active layer, a portion of the gate insulating layer located in the switching transistor 11a, another gate, a portion of the interlayer insulating layer located in the switching transistor 11a, and another source and another drain that are sequentially stacked.

Figure 11:
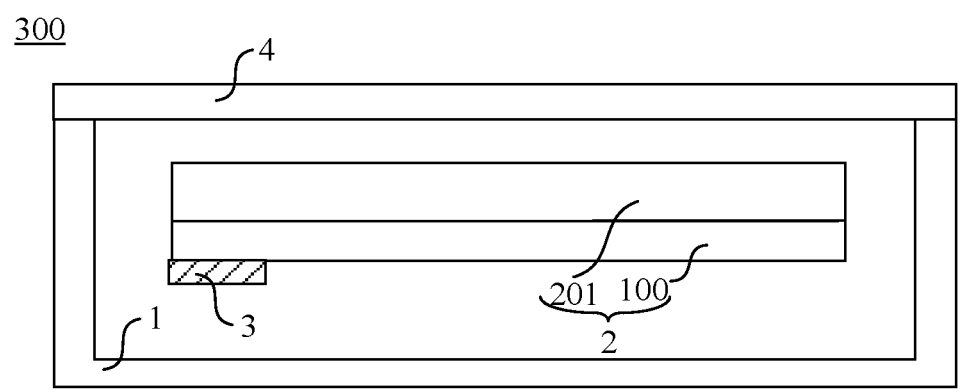
FIG. 11 is a diagram showing a structure of a display apparatus, in accordance with some embodiments.

In some other embodiments of the present disclosure, a display apparatus 300 is further provided. As shown in FIG. 11, the display apparatus 300 may include, for example, a frame 1, a display panel 2, a circuit board 3, a cover plate 4, a camera and other electronic accessories. The display panel 2 includes the display substrate 100 and an encapsulation layer 201.

The display apparatus 300 may be used as a mobile phone, a tablet computer, a personal digital assistant (PDA), a vehicle-mounted computer, etc. The embodiments of the present disclosure do not specifically limit a specific use of the display apparatus. The display apparatus may be, for example, an OLED display apparatus, or may also be a quantum dot light-emitting diode (QLED) display apparatus.

A light exit direction of the display panel 2 may be top-emitting, and the frame 1 may be a U-shaped frame. The display panel 2 and the circuit board 3 are disposed in the frame 1. The cover plate 4 is disposed on a light exit side of the display panel 2, and the circuit board 3 is disposed on a side of the display panel 2 facing away from the cover plate 4.

The beneficial effects achieved by the display apparatus 300 provided in some embodiments of the present disclosure are the same as the beneficial effects achieved by the display substrate 100 described above, which will not be described herein again.

Figure 12:
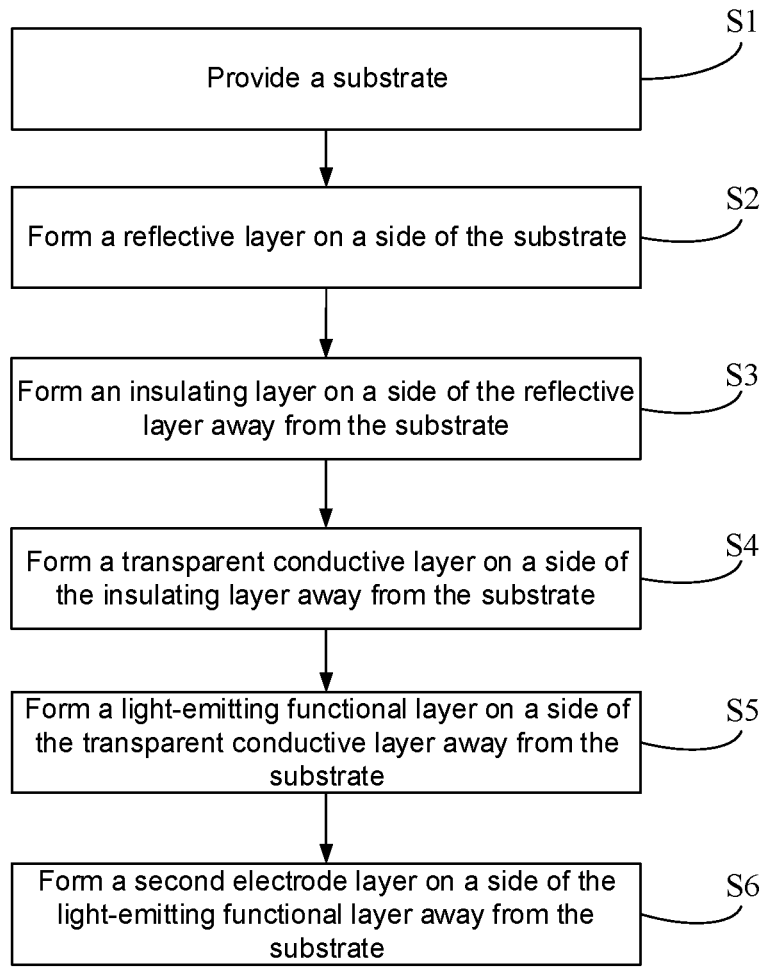
FIG. 12 is a flow diagram of a method for manufacturing a display substrate, in accordance with some embodiments.

In yet some other embodiments of the present disclosure, a method for manufacturing the display substrate 100 is further provided. As shown in FIG. 12, the method includes following steps.

In S1, a substrate 10 is provided.

In S2, a reflective layer 121 is formed on a side of the substrate 10.

In S3, an insulating layer 122 is formed on a side of the reflective layer 121 away from the substrate 10.

In S4, a transparent conductive layer 123 is formed on a side of the insulating layer 122 away from the substrate 10.

In S5, a light-emitting functional layer 13 is formed on a side of the transparent conductive layer 123 away from the substrate 10.

In S6, a second electrode layer 14 is formed on a side of the light-emitting functional layer 13 away from the substrate 10.

The display substrate 100 has a plurality of sub-pixel regions. The plurality of sub-pixel regions includes at least one red sub-pixel region 101, at least one green sub-pixel region 102, and at least one blue sub-pixel region 103. In the plurality of sub-pixel regions, vertical distances from portions, located in the plurality of sub-pixel regions, of a surface of the reflective layer 121 away from the substrate to the substrate are all equal, and vertical distances from portions, located in the plurality of sub-pixel regions, of a surface of the insulating layer 122 away from the substrate 10 to the second electrode layer 14 are all equal.

In the red sub-pixel region 101, a thickness of a first portion of the insulating layer 122 located between the reflective layer 121 and the transparent conductive layer 123 is within a range of about 1000 Å to about 2500 Å. In the green sub-pixel region 102, a thickness of a second portion of the insulating layer 122 located between the reflective layer 121 and the transparent conductive layer 123 is within a range of about 500 Å to about 2000 Å. In the blue sub-pixel region 103, a thickness of a third portion of the insulating layer 122 located between the reflective layer 121 and the transparent conductive layer 123 is within a range of about 1500 Å to about 3000 Å.

The display substrate 100 manufactured by using the method for manufacturing the display substrate provided in some embodiments of the present disclosure may make microcavity lengths of the light-emitting device layer 01 corresponding to the red sub-pixel region 101, the green sub-pixel region 102, and the blue sub-pixel region 103 large. As a result, the FWHMs of the emission spectra of the light-emitting device layer 01 in different sub-pixel regions may be improved, so that the FWHM of the emission spectrum in each sub-pixel region is reduced, and the color purity of light emitted by the light-emitting device layer 01 in each sub-pixel region is high. In this way, not only the light-emitting performance of the light-emitting device layer may be improved, but also light emitted by the light-emitting device layer in the sub-pixel region of each color may be uniform. In a case where the display substrate is applied to the display panel, a display quality of the display panel may be improved.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present to disclosure shall be subject to the protection scope of the claims.

What is claimed is:

1. A display substrate having a plurality of sub-pixel regions, the plurality of sub-pixel regions including at least one red sub-pixel region, at least one green sub-pixel region, and at least one blue sub-pixel region; the display substrate comprising:

a substrate;

a light-emitting device layer disposed on a side of the substrate; the light-emitting device layer including a first electrode layer, a light-emitting functional layer, and a second electrode layer that are sequentially stacked in a direction away from the substrate, and the first electrode layer including a reflective layer, an insulating layer, and a transparent conductive layer that are sequentially stacked in the direction away from the substrate, wherein vertical distances from portions, located in the plurality of sub-pixel regions, of a surface of the reflective layer away from the substrate to the substrate are all equal, and vertical distances from portions, located in the plurality of sub-pixel regions, of a surface of the insulating layer away from the substrate to the second electrode layer are all equal;

in a red sub-pixel region, a thickness of a first portion of the insulating layer located between the reflective layer and the transparent conductive layer is within a range of about 1000 Å to about 2500 Å; in a green sub-pixel region, a thickness of a second portion of the insulating layer located between the reflective layer and the transparent conductive layer is within a range of about 500 Å to about 2000 Å; in a blue sub-pixel region, a thickness of a third portion of the insulating layer located between the reflective layer and the transparent conductive layer is within a range of about 1500 Å to about 3000 Å;

the reflective layer includes a plurality of reflective units that are spaced apart from each other, and the transparent conductive layer includes a plurality of transparent conductive units that are spaced apart from each other; and the transparent conductive units and the reflective units are in one-to-one correspondence, a transparent conductive unit and a corresponding reflective unit are electrically connected, and the transparent conductive unit and the reflective unit that are correspondingly electrically connected are located in a same sub-pixel region; in the same sub-pixel region, an orthogonal projection of the reflective unit on the substrate is within a range of an orthographic projection of a corresponding transparent conductive unit on the substrate; wherein the transparent conductive unit includes a flat surface in a middle and side faces on peripheries, and an included angle between the flat surface and a side face is an obtuse angle; and the orthogonal projection of the reflective unit on the substrate substantially overlaps with an orthogonal projection of the flat surface on the substrate.

2. The display substrate according to claim 1, wherein the reflective unit includes a metal portion.

3. The display substrate according to claim 2, wherein a material of the metal portion includes aluminum.

4. The display substrate according to claim 2, wherein the reflective unit further includes:
a first protective portion disposed on a side of the metal portion facing away from the transparent conductive layer.

5. The display substrate according to claim 4, wherein the first protective portion includes:
a first protective sub-portion, and a material of the first protective sub-portion including titanium; and/or
a second protective sub-portion, and a material of the second protective sub-portion including titanium nitride.

6. The display substrate according to claim 5, wherein the first protective portion includes the first protective sub-portion and the second protective sub-portion, and the first protective sub-portion is located on a side of the second protective sub-portion away from the metal portion.

7. The display substrate according to claim 4, wherein the first protective portion is a conductive protective portion, or the first protective portion is an insulating protective portion.

8. The display substrate according to claim 2, wherein the reflective unit further includes:
a second protective portion disposed on a side of the metal portion proximate to the transparent conductive layer.

9. The display substrate according to claim 8, wherein the second protective portion includes:
a third protective sub-portion, and a material of the third protective sub-portion including titanium; and/or
a fourth protective sub-portion, and a material of the fourth protective sub-portion including titanium nitride.

10. The display substrate according to claim 9, wherein the second protective portion includes the third protective sub-portion and the fourth protective sub-portion, and the third protective sub-portion is located on a side of the fourth protective sub-portion away from the metal portion.

11. The display substrate according to claim 8, wherein the second protective portion is a conductive protective portion, or the first protective portion is an insulating protective portion.

12. The display substrate according to claim 1, wherein the insulating layer is provided with a plurality of via holes therein, and the transparent conductive unit is electrically connected with the corresponding reflective unit through a via hole.

13. The display substrate according to claim 12, wherein the via hole is filled with tungsten.

14. The display substrate according to claim 1, wherein a thickness of the transparent conductive layer is within a range of about 100 Å to about 2000 Å.

15. The display substrate according to claim 1, further comprising:
a pixel circuit layer disposed between the substrate and the light-emitting device layer.

16. A display apparatus, comprising the display substrate according to claim 1.

17. The display substrate according to claim 1, wherein shapes of the orthogonal projection of the reflective unit on the substrate and the orthogonal projection of the corresponding transparent conductive unit on the substrate are same or different.

18. A method for manufacturing a display substrate, comprising:
providing a substrate;
forming a reflective layer on a side of the substrate;
forming an insulating layer on a side of the reflective layer away from the substrate;
forming a transparent conductive layer on a side of the insulating layer away from the substrate;
forming a light-emitting functional layer on a side of the transparent conductive layer away from the substrate; and
forming a second electrode layer on a side of the light-emitting functional layer away from the substrate; wherein
the display substrate has a plurality of sub-pixel regions, and the plurality of sub-pixel regions include at least one red sub-pixel region, at least one green sub-pixel region, and at least one blue sub-pixel region; vertical distances from portions, located in the plurality of sub-pixel regions, of a surface of the reflective layer away from the substrate to the substrate are all equal, and vertical distances from portions, located in the plurality of sub-pixel regions, of a surface of the insulating layer away from the substrate to the second electrode layer are all equal;
in a red sub-pixel region, a thickness of a first portion of the insulating layer located between the reflective layer and the transparent conductive layer is within a range of about 1000 Å to about 2500 Å; in a green sub-pixel region, a thickness of a second portion of the insulating layer located between the reflective layer and the transparent conductive layer is within a range of about 500 Å to about 2000 Å; in a blue sub-pixel region, a thickness of a third portion of the insulating layer located between the reflective layer and the transparent conductive layer is within a range of about 1500 Å to about 3000 Å;

the reflective layer includes a plurality of reflective units that are spaced apart from each other, and the transparent conductive layer includes a plurality of transparent conductive units that are spaced apart from each other; and the transparent conductive units and the reflective units are in one-to-one correspondence, a transparent conductive unit and a corresponding reflective unit are electrically connected, and the transparent conductive unit and the reflective unit that are correspondingly electrically connected are located in a same sub-pixel region; in the same sub-pixel region, an orthogonal projection of the reflective unit on the substrate is within a range of an orthographic projection of a corresponding transparent conductive unit on the substrate; wherein the transparent conductive unit includes a flat surface in a middle and side faces on peripheries, and an included angle between the flat surface and a side face is an obtuse angle; and the orthogonal projection of the reflective unit on the substrate substantially overlaps with an orthogonal projection of the flat surface on the substrate.

19. A display substrate having a plurality of sub-pixel regions, the plurality of sub-pixel regions including at least one red sub-pixel region, at least one green sub-pixel region, and at least one blue sub-pixel region; the display substrate comprising:

a substrate;

a light-emitting device layer disposed on a side of the substrate; the light-emitting device layer including a first electrode layer, a light-emitting functional layer, and a second electrode layer that are sequentially stacked in a direction away from the substrate, and the first electrode layer including a reflective layer, an insulating layer, and a transparent conductive layer that are sequentially stacked in the direction away from the substrate, wherein vertical distances from portions, located in the plurality of sub-pixel regions, of a surface of the reflective layer away from the substrate to the substrate are all equal, and vertical distances from portions, located in the plurality of sub-pixel regions, of a surface of the insulating layer away from the substrate to the second electrode layer are all equal;

in a red sub-pixel region, a thickness of a first portion of the insulating layer located between the reflective layer and the transparent conductive layer is within a range of about 1000 Å to about 2500 Å; in a green sub-pixel region, a thickness of a second portion of the insulating layer located between the reflective layer and the transparent conductive layer is within a range of about 500 Å to about 2000 Å; in a blue sub-pixel region, a thickness of a third portion of the insulating layer located between the reflective layer and the transparent conductive layer is within a range of about 1500 Å to about 3000 Å;

the reflective layer includes a plurality of reflective units that are spaced apart from each other, and the transparent conductive layer includes a plurality of transparent conductive units that are spaced apart from each other; and the transparent conductive units and the reflective units are in one-to-one correspondence, a transparent conductive unit and a corresponding reflective unit are electrically connected, and the transparent conductive unit and the reflective unit that are correspondingly electrically connected are located in a same sub-pixel region; in the same sub-pixel region, an orthogonal projection of the reflective unit on the substrate is within a range of an orthographic projection of a corresponding transparent conductive unit on the substrate; wherein the insulating layer is provided with a plurality of via holes therein, and the transparent conductive unit is electrically connected with the corresponding reflective unit through a via hole.

* * * * *